United States Patent
Schmutzler et al.

(10) Patent No.: US 9,841,437 B2
(45) Date of Patent: Dec. 12, 2017

(54) SOLDERLESS PIM TEST FIXTURE

(71) Applicant: COMMSCOPE TECHNOLOGIES, LLC, Hickory, NC (US)

(72) Inventors: Steven Lee Schmutzler, Homer Glen, IL (US); Scott R. Sladek, Carol Stream, IL (US); Jonathon C. Veihl, New Lenox, IL (US)

(73) Assignee: CommScope Technologies LLC, Hickory, NC (US)

( * ) Notice: Subject to any disclaimer, the term of this patent is extended or adjusted under 35 U.S.C. 154(b) by 223 days.

(21) Appl. No.: 14/807,432

(22) Filed: Jul. 23, 2015

(65) Prior Publication Data

US 2016/0124015 A1    May 5, 2016

Related U.S. Application Data

(60) Provisional application No. 62/074,244, filed on Nov. 3, 2014.

(51) Int. Cl.

| | |
|---|---|
| *G01R 31/00* | (2006.01) |
| *G01R 1/04* | (2006.01) |
| *H01R 13/6592* | (2011.01) |
| *H01R 9/05* | (2006.01) |
| *H01R 13/73* | (2006.01) |
| *G01R 31/02* | (2006.01) |

(52) U.S. Cl.
CPC ......... *G01R 1/0416* (2013.01); *G01R 1/0408* (2013.01); *G01R 31/021* (2013.01); *G01R 31/024* (2013.01); *H01R 9/05* (2013.01); *H01R 13/6592* (2013.01); *H01R 13/73* (2013.01)

(58) Field of Classification Search
CPC .. G01R 1/0416; G01R 1/067; G01R 1/07378; G01R 31/041; G01R 31/2808
See application file for complete search history.

(56) References Cited

U.S. PATENT DOCUMENTS

| | | | |
|---|---|---|---|
| 5,017,865 A | * | 5/1991 | Oldfield ............ G01R 31/2822 324/754.14 |
| 6,250,959 B1 | | 6/2001 | Yamaguchi |
| 6,428,356 B1 | | 8/2002 | Dole |
| 6,710,604 B2 | * | 3/2004 | Christopherson .... G01R 31/021 324/543 |

(Continued)

FOREIGN PATENT DOCUMENTS

| | | |
|---|---|---|
| CN | 101 169 992 | 4/2008 |
| WO | WO 2006/093300 | 9/2006 |

OTHER PUBLICATIONS

International Search Report regarding PCT/US2015/041780, dated Oct. 23, 2015 (6 pgs.).

(Continued)

*Primary Examiner* — Tung X Nguyen
(74) *Attorney, Agent, or Firm* — Myers Bigel, P.A.

(57) ABSTRACT

A solderless test fixture, including a conductive base, a clamp, and a connector is described. The conductive base has at least one cable groove with a cable grounding portion. A clamp is mounted on the base and associated with the cable groove. A connector is associated with the cable groove and has a solderless center terminal aligned with the cable groove and an outer shield being mechanically and electrically connected to the base.

12 Claims, 6 Drawing Sheets

(56) References Cited

U.S. PATENT DOCUMENTS

2004/0060171 A1    4/2004  Edwardsen
2013/0069670 A1    3/2013  Nonen

OTHER PUBLICATIONS

Written Opinion of the International Searching Authority regarding PCT/US2015/041780, dated Oct. 23, 2015 (5 pgs.).

Notification Concerning Transmittal of International Preliminary Report on Patentability corresponding to International Application No. PCT/US2015/041780 dated May 18, 2017.

\* cited by examiner

SOLDERLESS PIM TEST FIXTURE

BACKGROUND

There is a need to test coaxial cable and other passive devices for discontinuities which would result in undesirable passive inter modulation (PIM). A known method of testing coaxial cable for PIM is to solder a 7-16 DIN connector to each end of the cable, attach a load to one end and test equipment to the other end. The disadvantage with this known solution is its expense—the connectors must be soldered on, incurring a labor cost, and then cut off and discarded after each test, incurring a hardware cost. Occasionally, the soldering of the connector is faulty, rather than in the cable or other device under test, requiring additional time and expense to re-do the soldered connection. What is necessary is an apparatus and method for testing coaxial cable and/or passive devices, which avoids the disadvantages of one-time use of soldered connectors.

SUMMARY

A solderless test fixture is provided herein. According to a first example, a solderless test fixture includes a conductive base, a clamp, and a connector. The conductive base has at least one cable groove including a cable grounding portion. In a preferred example, the cable groove is dimensioned to retain an unstripped portion of a cable and the cable grounding portion has a smaller cross section and dimensioned to engage a shield of a cable that has been stripped of outer insulation. The cable groove may have a V-shaped cross section. In one example, the conductive base and cable groove are machined from conductive metal.

The clamp is mounted on the base and associated with the cable groove. The clamp also includes a cable retainer. In a preferred example, the cable retainer has a cable retention portion dimensioned to retain an unstripped portion of a cable and a shield retention portion dimensioned to engage a shield of a cable that has been stripped of insulation. In one example, the cable retention portion includes first ribs dimensioned to fit between walls of the cable groove and a cable under test, and the shield retention portion includes second ribs dimensioned to fit between walls of the grounding portion of the cable groove and a shield conductor of a cable under test. The connector is associated with the cable groove and has a solderless center terminal aligned with the cable groove and an outer shield being mechanically and electrically connected to the base.

The solderless test fixture may include a plurality of cable grooves as described above, each with a corresponding clamp and connector. Each cable groove and cable retainer is dimensioned to accept a coaxial cable of a pre-determined size. Different cable grooves and cable retainers may be dimensioned to accept cables of different sizes.

DESCRIPTION

Figure 1:
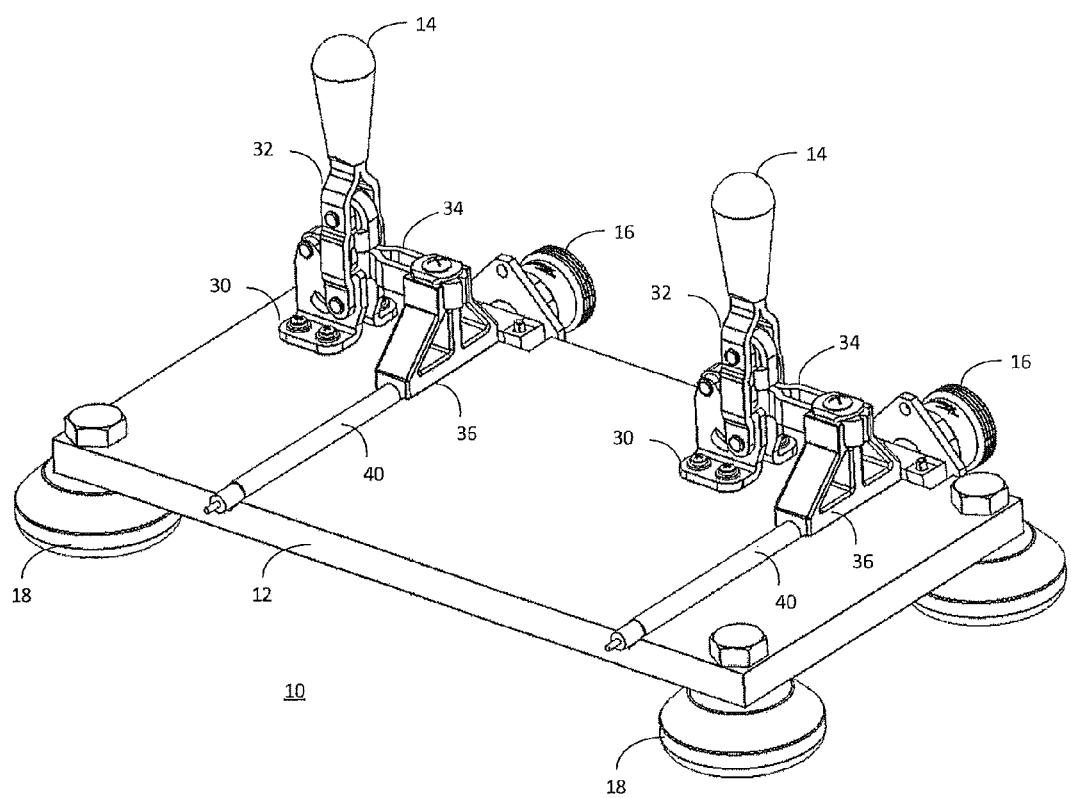
FIG. 1 is an isometric view of a Solderless PIM Test Fixture according to one example of the present invention.
Figure 2:
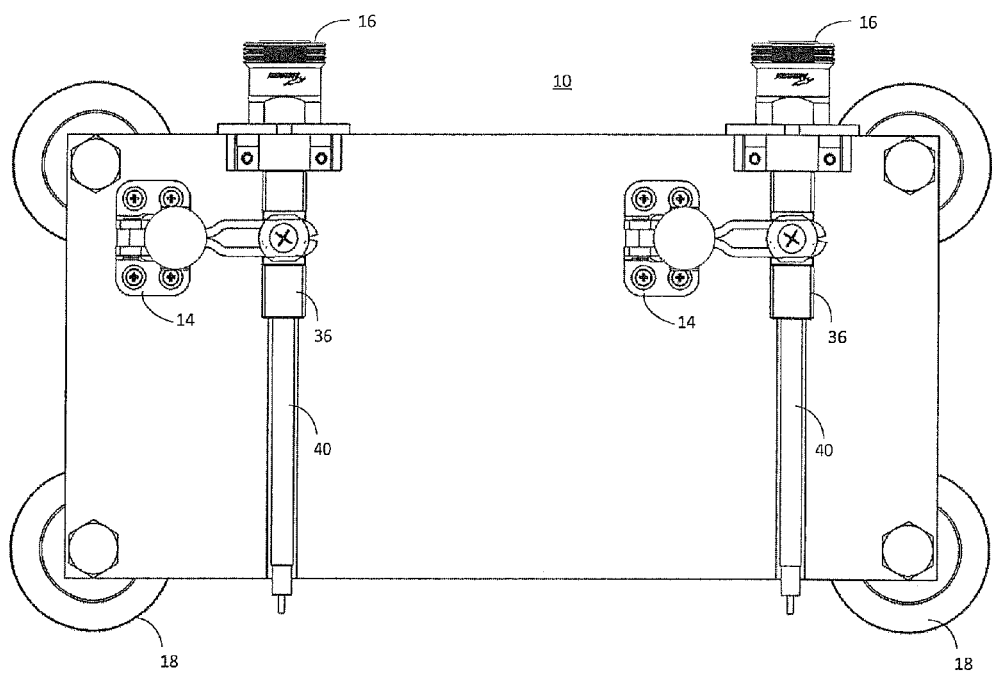
FIG. 2 is a plan view of a Solderless PIM Test Fixture according to one example of the present invention.

Referring to FIGS. 1 and 2, a solderless PIM Test Fixture 10 according to one example of the present invention may comprise a base 12, one or more clamps 14, one or more solderless connectors 16, and feet 18. The base 12 is machined from a conductive metal. The clamps 14 are mounted on the base 12. In a typical configuration, two clamps are included, however, greater or fewer clamps may also be included depending on how many cable terminations are desired for testing.

Figure 3:
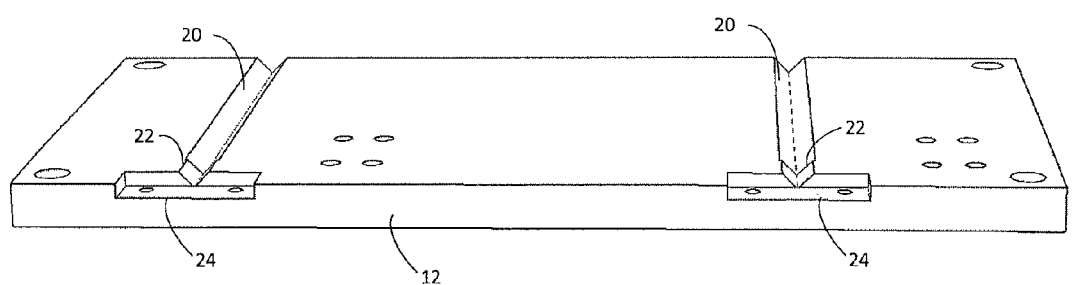
FIG. 3 is a view of a base of a Solderless PIM Test Fixture according to one aspect of the present invention.

Referring to FIG. 3, cable grooves 20 are machined into the base 12. Each cable groove 20 is dimensioned to accept a coaxial cable of a pre-determined size. Cable groove 20 includes a grounding portion 22 close to a connector mounting location 24. Cable grooves of different sizes may be included to accommodate more than one coaxial cable size. The depth and cross section of the grounding portion 22 is slightly less than the depth and cross section of the remainder of the cable size of the cable groove 20. In particular, the grounding portion 22 is dimensioned to accept a portion of coaxial cable once a layer of outer insulation is removed, thereby exposing an outer shield of the coaxial cable.

Figure 4:
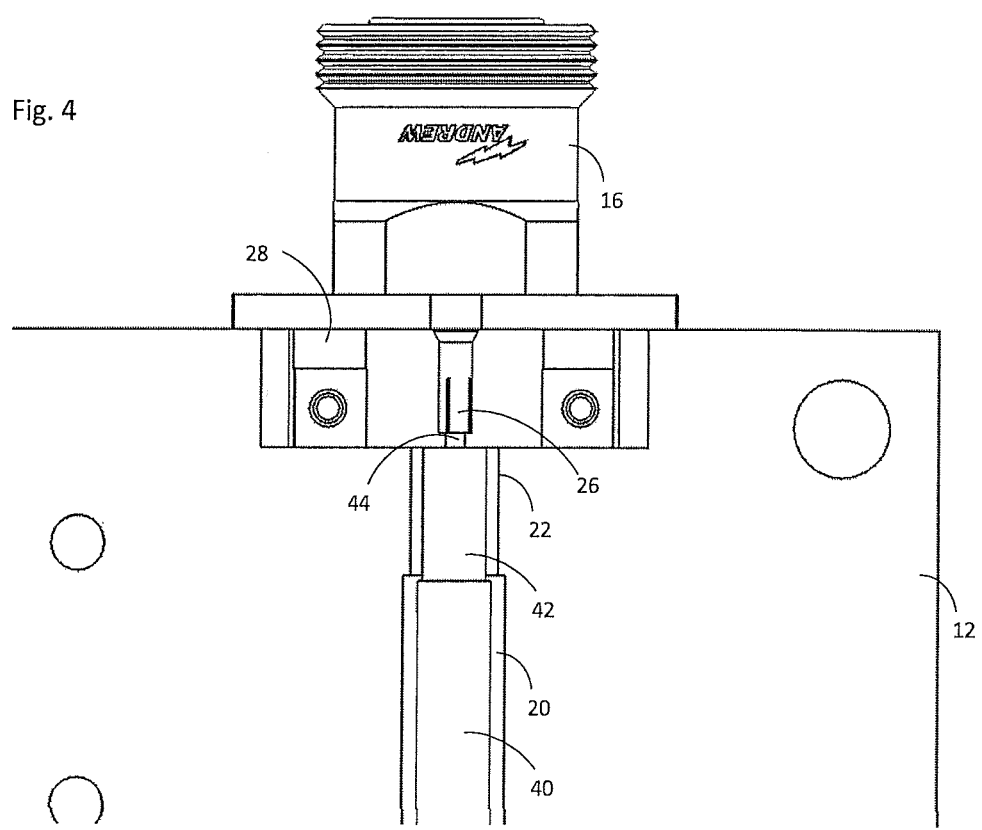
FIG. 4 is a view of a cable termination on a Solderless PIM Test Fixture according to another aspect of the present invention.

For example, referring to FIG. 4, cable 40 is illustrated in cable groove 20. An outer shield 42 of cable 40 is illustrated with outer insulation removed. The outer shield 42 is in electrical contact with grounding portion 22. An inner conductor 44 of cable 40 is inserted into a center terminal 26 of connector 16. The center terminal 26 of the connector comprises a four section pin for push-in attachment of the center conductor 44 of cable 40. A resilient sleeve (not shown) may be applied to the center terminal 26 to increase the clamping force of the center terminal 26. The connector may further comprise a Teflon insulator surrounding the center terminal 26. The outer shield 28 of connector 16 is mechanically and electrically connected to the base 12.

Figure 5:
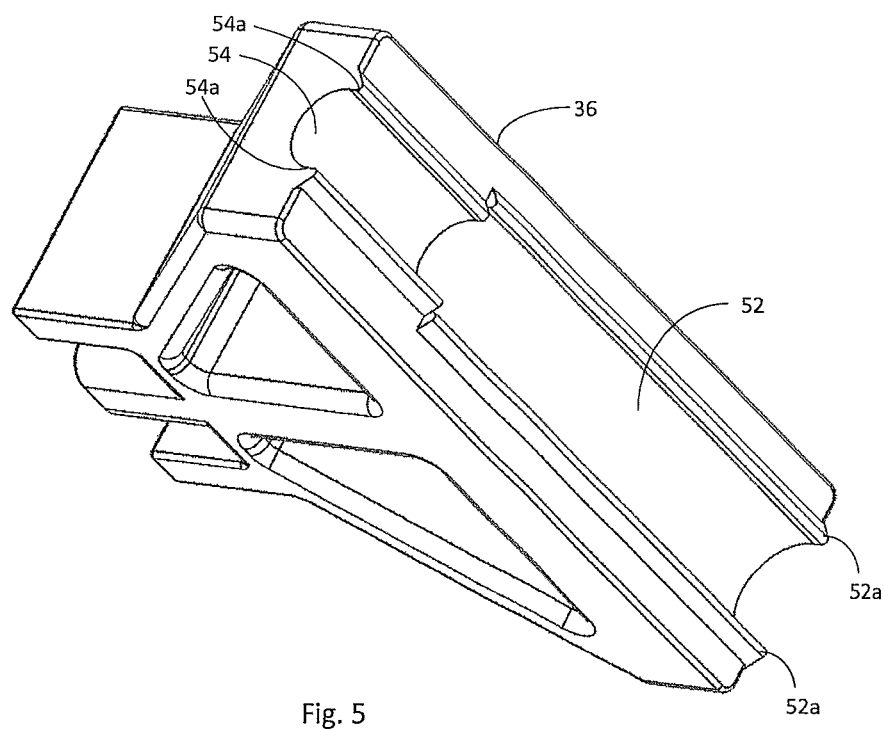
FIG. 5 is a detailed view of a cable retainer for a clamp according to another aspect of the present invention.

The clamps 14 may include a clamp base 30 mounted on the base 12, a lever arm 32, a clamp arm 34, and a cable retainer 36. Referring to FIG. 5, cable retainer 36 has features to improve the electrical and mechanical connections of the cable 40 and outer shield 42 to the base 12. In particular, cable retainer 36 includes a cable retention portion 52 and shield retention portion 54. The cable retention portion is dimensioned to securely engage a cable 40. The shield retention portion 54 is dimensioned to engage the outer shield 42 of the cable 40 after the outer insulation is removed. The cable retention portion 52 and shield retention portion 54 further includes ribs 52a, 54a, respectively. Ribs 52a are dimensioned to fit into the groove 20 between the cable 40 and the walls of the groove 20, thereby reducing potential movement of the cable 40 relative to the base 12. Ribs 54a are dimensioned to fit into the grounding portion 22 of groove 20 between the outer shield 42 and the grounding portion 22. Ribs 54a improve electrical grounding of outer shield 42 to base 12. Maintaining sufficient mechanical clamping force of the outer shield 42 to the grounding portion 22 is important to making reliable measurements.

Figure 6:
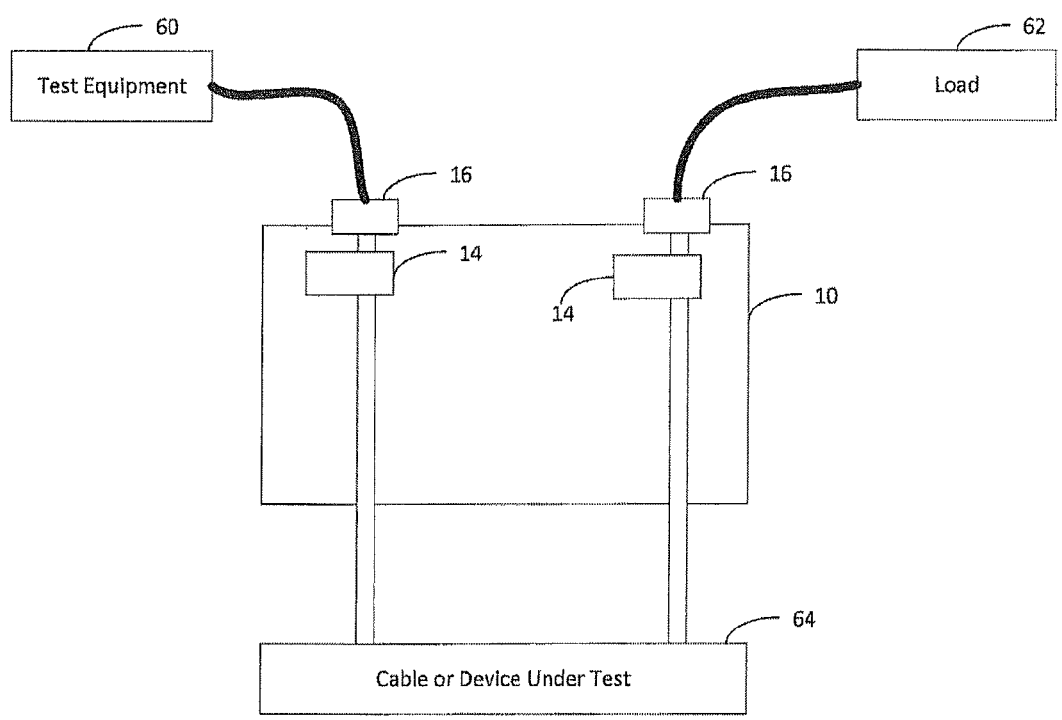
FIG. 6 is a diagram of a Solderless PIM Fixture in use.

Referring to FIG. 6, a Solderless PIM Fixture 10 is illustrated connected to test equipment 60 and a load 62 via connectors 16. Cables are secured by clamps 14, and a cable or other device under test 64 is also connected to the Solderless PIM Fixture 10. In use, a length of cable may be tested by stripping a portion of the outer insulator to reveal the outer shield, and further stripping a portion of the outer shield and insulation to reveal the center conductor. The center conductor is than inserted into the center pin of the solderless connector, and the outer shield 42 is clamped into grounding portion 22. The load 62 or test equipment 60 may be connected to connectors 16. When the test is completed, the clamp may be released and the cable removed. There is no need to solder on connectors, or to discard used connectors. All components are reusable.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

What is claimed is:

1. A solderless test fixture, comprising:
   a. a conductive base, the base having at least one cable groove including a cable grounding portion;
   b. at least one clamp mounted on the base and associated with the at least one cable groove, the clamp including a cable retainer; and
   c. at least one connector associated with the at least one cable groove, the connector having a solderless center terminal and an outer shield, the outer shield being mechanically and electrically connected to the base;
   wherein the base includes a connector mounting location and the at least one cable grove includes a grounding portion close to the connector mounting location, wherein a cross section of the grounding portion is slightly smaller than a cross section of the remainder of the cable groove.

2. The solderless test fixture of claim 1, wherein the base is machined from conductive metal.

3. The solderless test fixture of claim 1, further comprising a plurality of cable grooves, a plurality of clamps, and a plurality of connectors.

4. The solderless test fixture of claim 1, wherein the center terminal of the at least one connector is aligned with a longitudinal axis of the at least one cable groove.

5. The solderless test fixture of claim 1, wherein the at least one cable groove is dimensioned to accept a coaxial cable of a pre-determined size.

6. The solderless test fixture of claim 1, wherein the grounding portion is dimensioned to accept an outer shield of a coaxial cable once a layer of outer insulation is removed.

7. The solderless test fixture of claim 1, wherein the cable groove has a V-shaped cross section.

8. The solderless test fixture of claim 1, wherein the cable retainer of the clamp includes a cable retention portion and a shield retention portion.

9. The solderless test fixture of claim 8, wherein the cable retention portion includes first ribs dimensioned to fit between walls of the cable groove and a cable under test, and the shield retention portion includes second ribs dimensioned to fit between walls of the grounding portion of the cable groove and a shield conductor of the cable under test.

10. A solderless test fixture, comprising:
    a. a conductive metal base, the base having at least one cable groove including a cable grounding portion having a cross section slightly smaller than a cross section of a remainder of the cable groove, and at least one connector mounting location adjacent to the cable grounding portion;
    b. at least one clamp mounted on the base and associated with the at least one cable groove having a longitudinal axis, the clamp including a cable retainer including a cable retention portion and a shield retention portion; and
    c. at least one connector associated with the at least one cable groove, the connector having a solderless center terminal and an outer shield, the center terminal being aligned with the longitudinal axis of the at least one cable groove and the outer shield being mechanically and electrically connected to the base;
    wherein the cable retention portion includes first ribs dimensioned to fit between walls of the cable groove and a cable under test, and the shield retention portion includes second ribs dimensioned to fit between walls of the grounding portion of the cable groove and a shield conductor of a cable under test.

11. The solderless test fixture of claim 10, further comprising a plurality of cable grooves, a plurality of clamps, and a plurality of connectors.

12. The solderless test fixture of claim 10, wherein the grounding portion is dimensioned to accept an outer shield of a coaxial cable once a layer of outer insulation is removed.

* * * * *

UNITED STATES PATENT AND TRADEMARK OFFICE
CERTIFICATE OF CORRECTION

PATENT NO. : 9,841,437 B2
APPLICATION NO. : 14/807432
DATED : December 12, 2017
INVENTOR(S) : Schmutzler et al.

Page 1 of 1

It is certified that error appears in the above-identified patent and that said Letters Patent is hereby corrected as shown below:

In the Claims

Column 3, Claim 1, Line 32:
Please correct "one cable grove" to read -- one cable groove --

Signed and Sealed this
Tenth Day of April, 2018

Andrei Iancu
*Director of the United States Patent and Trademark Office*